(12) United States Patent
McCormick et al.

(10) Patent No.: US 6,431,432 B1
(45) Date of Patent: Aug. 13, 2002

(54) METHOD FOR ATTACHING SOLDERBALLS BY SELECTIVELY OXIDIZING TRACES

(75) Inventors: John Pierre McCormick, Palo Alto; Kishor V. Desai, Fremont, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/596,039

(22) Filed: Jun. 15, 2000

(51) Int. Cl.[7] .................................................. B23K 31/02
(52) U.S. Cl. ........................................ 228/254; 228/215
(58) Field of Search ........................ 228/254, 180.1, 228/180.21, 180.22, 206, 211, 215, 123.1; 438/613–617; 257/737, 738; 361/767, 768; 439/876

(56) References Cited

U.S. PATENT DOCUMENTS

| | | | |
|---|---|---|---|
| 4,357,069 A | * | 11/1982 | Milora |
| 5,156,997 A | * | 10/1992 | Kumar et al. |
| 5,345,056 A | * | 9/1994 | Frei et al. |
| 5,467,253 A | * | 11/1995 | Heckman et al. |
| 5,523,920 A | * | 6/1996 | Machuga et al. |
| 5,898,992 A | * | 5/1999 | Annable |
| 5,920,123 A | * | 7/1999 | Moden |
| 5,953,814 A | * | 9/1999 | Sozansky et al. |
| 5,954,751 A | * | 9/1999 | Chen et al. |
| 5,956,605 A | * | 9/1999 | Akram et al. |
| 5,964,395 A | * | 10/1999 | Glovatsky et al. |
| 5,973,406 A | * | 10/1999 | Harada et al. |
| 6,118,180 A | * | 9/2000 | Loo et al. |

* cited by examiner

*Primary Examiner*—Tom Dunn
*Assistant Examiner*—Jonathan Johnson
(74) *Attorney, Agent, or Firm*—Westman, Champlin & Kelly

(57) ABSTRACT

A solder mask is placed on a substrate but this solder mask is used to control solder spread but merely helps to protect traces that are distant from the bond pads. The solder mask has an opening that is preferably greater than the area of a die to be attached; this opening exposes both the bond pads and at least portions of traces proximate to the bond pads. The portions of the traces that are proximate to the bond pads are oxidized, thereby preventing solder from flowing onto these portions of the traces during the solder reflow process.

3 Claims, 4 Drawing Sheets

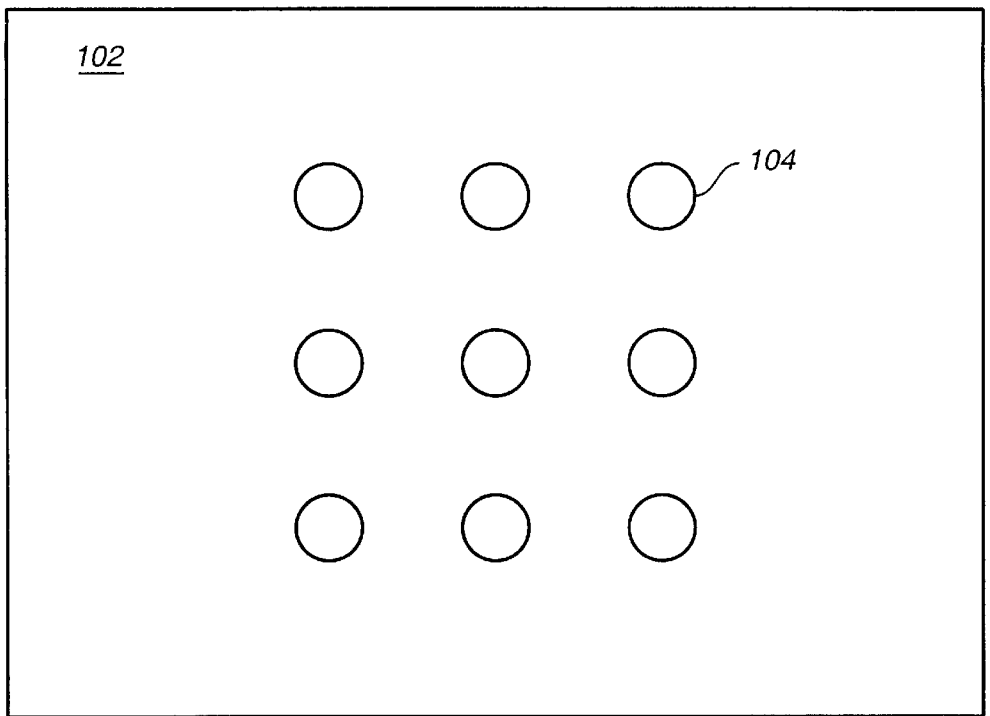
FIG._1a (PRIOR ART)
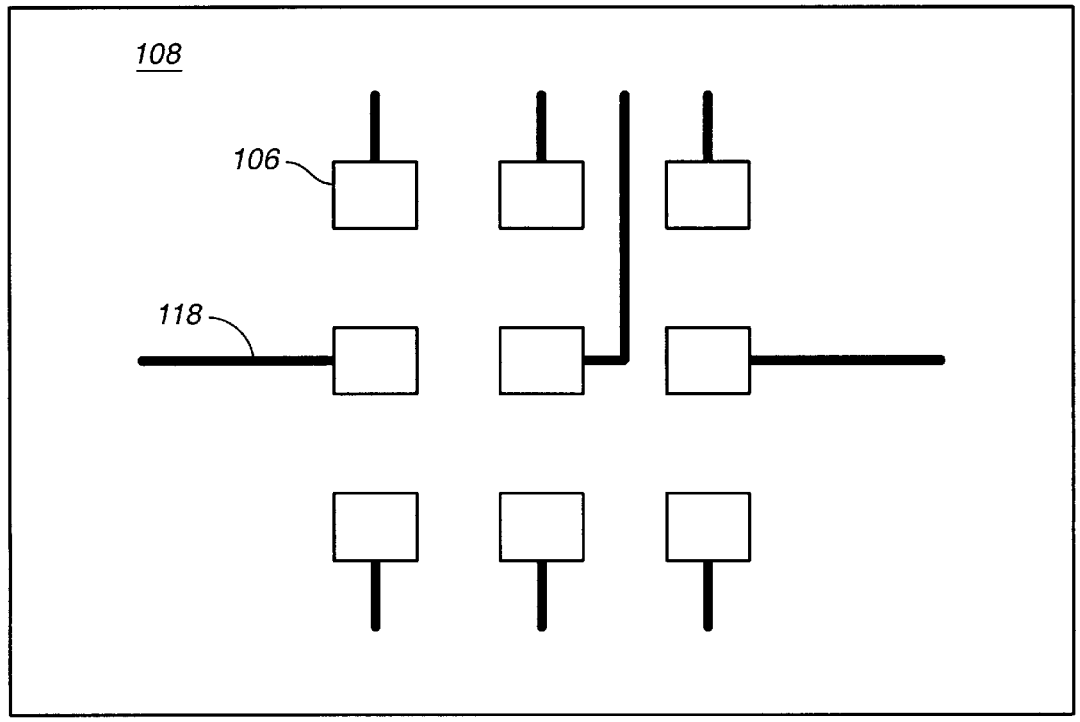
FIG._1b (PRIOR ART)

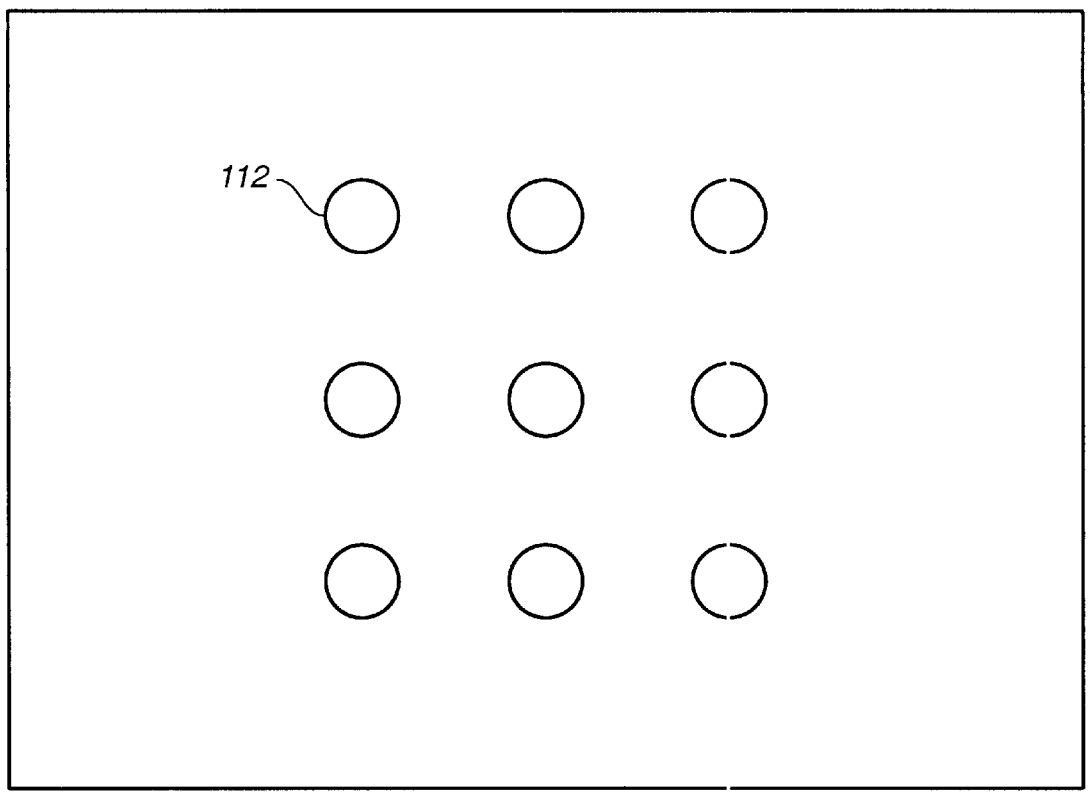
FIG._1c (PRIOR ART)
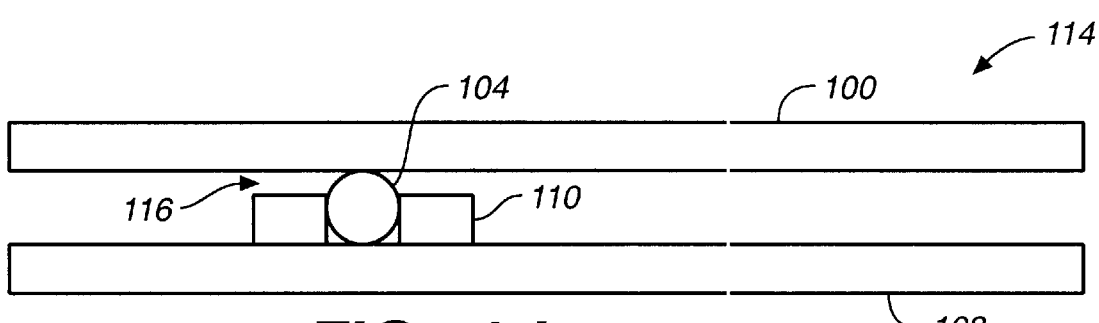
FIG._1d (PRIOR ART)

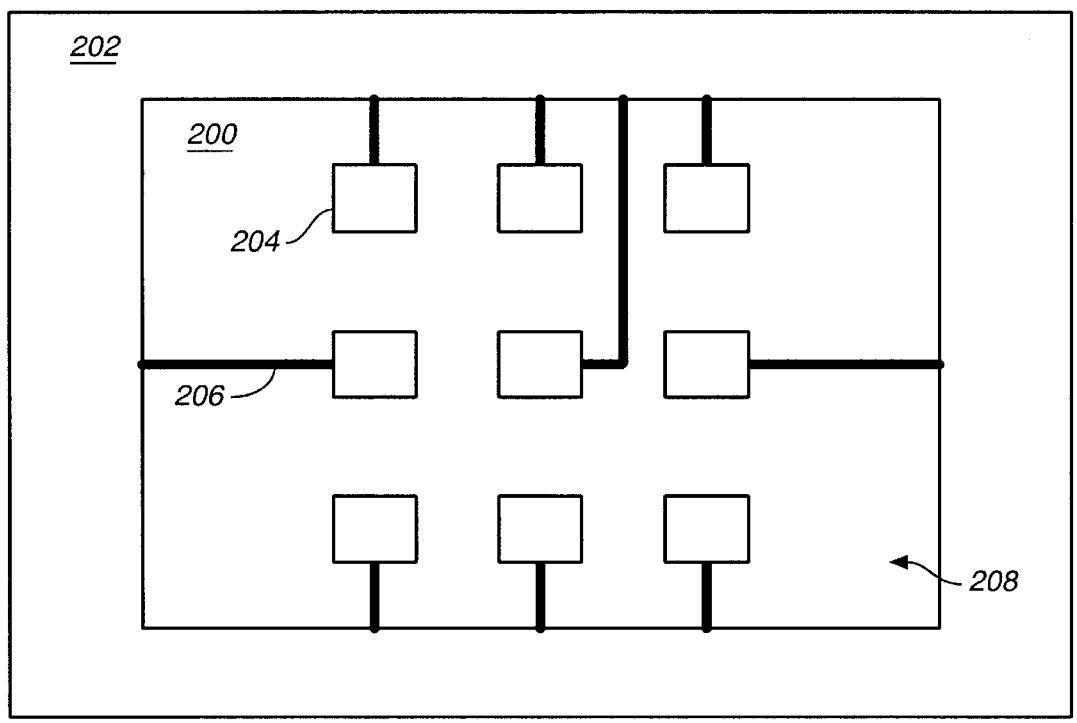
FIG._2

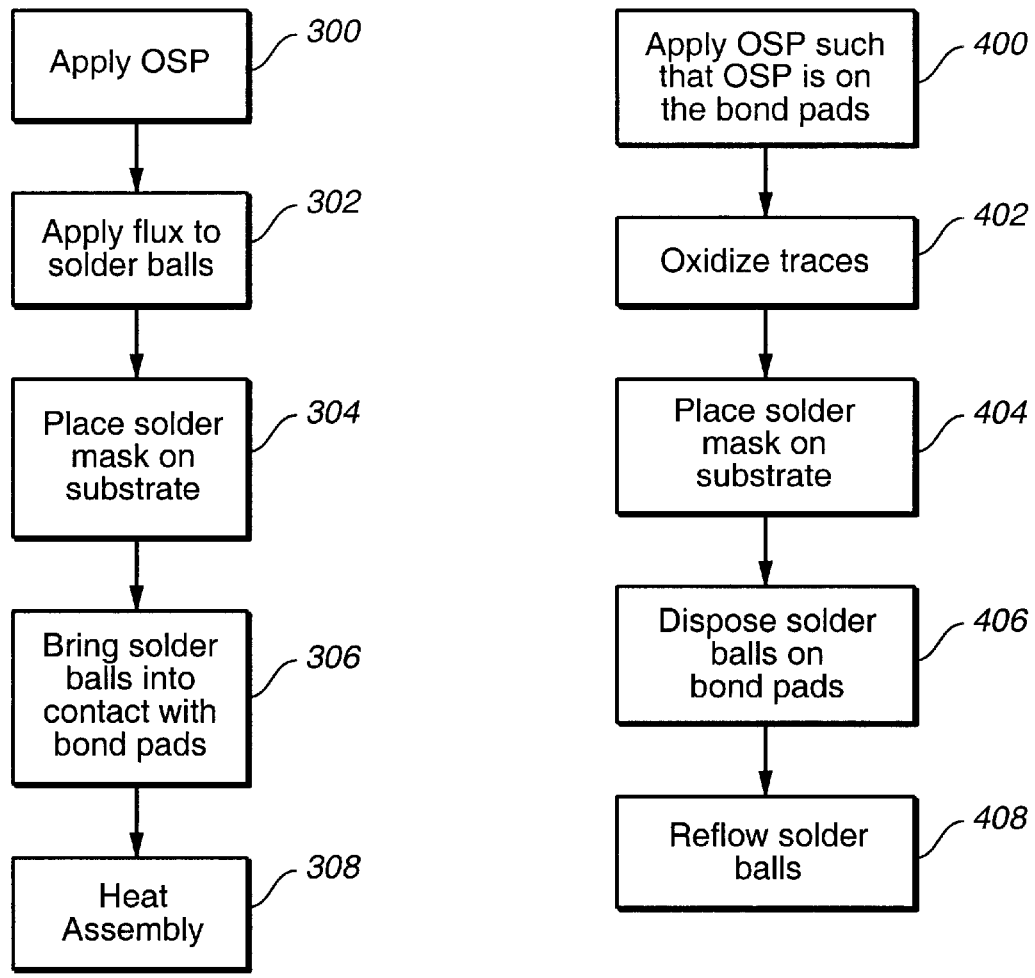

METHOD FOR ATTACHING SOLDERBALLS BY SELECTIVELY OXIDIZING TRACES

BACKGROUND OF THE INVENTION

1. Field of the Invention

This invention relates to methods for attaching solder balls to a substrate.

2. Description of the Related Art

In assembly of components including semiconductor chips, it is often necessary to attach conductors on one surface to conductors on another surface with solder balls. For example, the manufacture of a "flip chip" involves placing solder balls on the bond pads of a semiconductor chip and attaching the solder balls to corresponding conductive traces on a substrate, thereby electrically connecting the chip to the substrate.

A conventional technique for creating a flip chip is illustrated in FIGS. 1a–1b. FIG. 1a is an overhead view of an unbonded flip chip with a die 100 having an active circuit surface 102 on which are arranged a plurality of solder balls 104, which typically are an alloy comprising lead and tin. FIG. 1b is an overhead view of a substrate 108 to which the die 100 will be attached. The substrate comprises a plurality of bond pads 106, often comprising copper with a thin top layer of nickel/gold, each of a plurality of traces 118, typically copper, connected to a corresponding one of the plurality of bond pads 106. Frequently, substrates are produced by vendors that ship the substrates to whomever performs final assembly of the package. To protect the traces 118 from oxidizing and from mechanical damage during the shipment process, substrate vendors often apply an organic solderability preserve ("OSP") to the traces 118.

Prior to bonding the die 100 to the substrate 108, solder flux is applied to the plurality of solder balls 104 or the plurality of bond pads 106 on the substrate 108. Typical flux materials include low-solids, no-clean fluxes such as TAC-10 (produced by Indium Corp.) and Kester 9601 (produced by Kester Corporation). The flux serves primarily to aid the flow of the solder, such that the plurality of solder balls 104 make good contact with the plurality of bond pads 106. The flux may be applied in a variety of ways, including brushing or spraying, or dipping the die 100 into a thin film, thereby coating the plurality of solder balls 104 with flux.

As shown in FIG. 1c, the substrate 108 is overlaid with a solder mask 110. The solder mask 110 is typically 35 um thick and often comprises a dielectric material. As shown, the solder mask 110 has a plurality of holes 112 therein, each of the plurality of holes 112 corresponding to one of the plurality of solder balls 104. Each of the plurality of holes 112 exposes a corresponding one of the plurality of bond pads 106; the exposed bond pads contact the plurality of solder balls 104 when the die 100 and substrate 108 are moved toward each other. The solder mask 110 keeps the solder in the area of each of the bond pads 106 and thus prevents the solder from flowing onto the plurality of traces 118. Also, in the area outside the die placement area, the solder mask 110 provides mechanical protection and surface insulation resistance to the plurality of traces 118.

FIG. 1d is a cross sectional side view of an assembly 114 comprising the substrate 108 and the die 100 after the two have been brought together. The assembly 114 is heated, causing the plurality of solder balls 104 to reflow and thus to mechanically and electrically couple a pad on the die 100 to a corresponding one of the plurality of bond pads 106. During the reflow process, the solder mask 110 prevents the solder from flowing onto the plurality of traces 118. The assembly 114 is heated within a temperature range for a certain time to activate the flux ("soak time"). The temperature is then increased to cause the solder to reflow. After cooling, underfill is then dispensed into a gap 116 (shown in FIG. 1d) between the die 100 and the substrate 108. Since the solder mask 110 is typically 35 um thick, it reduces the gap 116 for underfill by about 15 um to 20 um.

This reduction in the gap between a chip and a substrate increases the difficulty of dispensing the underfill; specifically, a smaller gap impedes the flow of underfill between the chip and the substrate and thereby reduces the adhesion of the underfill. Reduced adhesion, in turn, results in decreased reliability of the attachment of die to substrate under conditions of stress, such as temperature cycling and moisture preconditioning. Solder masks have other drawbacks. For example, dimensional tolerances of the solder mask openings for the pads on the substrate can limit the density (pitch) between solder balls due to substrate manufacturing defects and defects involved in the assembly of the flip chip. These defects lower manufacturing yields and increase the cost of the substrate and the cost of flip chip assembly.

Therefore, it would be desirable to control solder spread by means other than a solder mask.

SUMMARY OF THE INVENTION

The present invention satisfies the above need to control solder spread on a substrate with bond pads by means other than a solder mask. According to one aspect of the present invention, a solder mask is placed on a substrate but this solder mask will not be used to control solder spread but merely helps to protect traces that are distant from the bond pads. The solder mask has an opening that is preferably greater than the area of a die to be attached; this opening exposes both the bond pads and at least portions of traces proximate to the bond pads. Since the traces proximate to the bond pads are not protected by a solder mask, the present invention employs at least one of two methods to control the flow of solder.

According to one of the methods, an appropriate combination of a flux and an OSP is selected along with particular process parameters (e.g. the shape of the solder reflow profile) to control solder spread. According to the other of the methods, the portions of the traces that are proximate to the bond pads are oxidized, thereby preventing solder from flowing onto these portions of the traces during the solder reflow process.

BRIEF DESCRIPTION OF THE DRAWINGS

Other objects and advantages of the invention will become apparent upon reading the following detailed description and upon reference to the accompanying drawings in which:

FIGS. 1a–1d show a conventional technique for creating a flip chip.

FIG. 2 is an overhead view of a substrate overlaid with a solder mask according to the present invention.

FIG. 3 is a flow chart that shows a method of attaching solder balls to a bond substrate by changing various process parameters.

FIG. 4 is a flow chart that shows a method of attaching solder balls to a bond substrate by oxidizing traces.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Definition

As used herein, a "solder ball" is a discrete piece of solder forming any type of three dimensional shape. For example, a "solder ball" need not be a sphere.

Description

FIG. 2 is an overhead view of a substrate 200 overlaid with a solder mask 202 according to the present invention. The substrate 200 comprises a plurality of bond pads 204 and a plurality of traces 206 connected thereto. The solder mask 202 has an opening 208 with an area preferably slightly larger (on the order of 0.5 mm or larger in the preferred embodiment) than the area of a die (shown as a dotted line) to which the substrate 202 will be attached. The opening 208 therefore exposes both the plurality of bond pads 204 and portions of the plurality of traces 206 proximate to the plurality of bond pads 204.

To control the spread of solder during solder reflow according to the present invention, instead of using a solder mask, two methods may be utilized, separately or in combination: (i) selection of an appropriate flux in combination with appropriate variance of process parameters; and (ii) selective application of an OSP along with oxidation of metal traces. These two techniques will be discussed in turn.

The methods comprising the present invention may be used to attach solder balls in any type of configuration to a substrate. For example, the present invention may be used to attach solder balls on an active surface of a die to a substrate. As another example, solder balls on the bottom surface of a package substrate may be attached to a printed wiring board according to the present invention. Still further, the present invention may be used to dispose solder balls on an active surface of a die (which may then be attached to a substrate as mentioned above); in this case, the solder balls may be placed on the die individually, as opposed to being disposed on a surface (such as an active surface of a die) which is then brought into contact with the substrate.

Selection of Flux/Process Parameters

FIG. 3 is a flow chart that shows a method of attaching solder balls to a bond substrate according to one aspect of the present invention. Particular process parameter values will be discussed below in the section entitled "Experimental Results." In step 300, an organic solderability preservative (OSP) is applied to the bond pads on the substrate. (As mentioned above, frequently, substrates are produced by vendors that ship the substrates to whomever performs final assembly of the package. To protect traces on the substrate from oxidizing and from mechanical damage during the shipment process, substrate vendors often apply an OSP to the copper traces on the substrate. However, if a given substrate does not have OSP applied to the bond pads, the OSP may be added by the package assembler.) The type of OSP coating can be selected given the desired interaction between the bond pad, flux and OSP. According to one embodiment, MECSEAL CL-5824E-1 from MEC Company Ltd. or OSP from Enthone (USA) is used. The OSP layer is preferably 0.1–0.7 um thick; the thickness, like the type of OSP coating, may be adjusted according to the desired interaction of a flux (to be applied, as will be described below) with the OSP.

In step 302, a flux is applied to the solder balls by any method. For example, the flux may be directly applied to the solder balls (such as by dipping or spraying) or the flux may be indirectly applied to the solder balls by first applying the flux to the bond pads. The type of flux used can be changed to adjust the activity of the flux (the degree or rate of interaction of with solder and copper oxides) to alter the spread of solder on the bond pad. The flux thickness can be adjusted, from 1–2.5 mils thick and 35 mil diameter (according to typical ranges of these dimensions) to 1–1.5 mils thick and 10–15 mils diameter. The "Experimental Results" section describes the effects of particular flux thicknesses. The lower amount of flux will limit the reaction of flux with OSP, enabling soldering to take place. The type and amount of flux selected will generally depend upon the type of OSP and the condition of the bond pad under the OSP coating, such as the degree of oxidation of the bond pad.

In step 304, a solder mask such as the solder mask shown in FIG. 2 is placed on the substrate.

In step 306, the die is flipped on to the substrate, creating an assembly, such that the solder balls are brought into contact with corresponding bond pads. The force with which the solder balls are brought into contact with the corresponding bond pads is preferably selected to control the spread of solder such that, when reflowed, the solder does not impinge upon the traces. The assembly is then heated, as shown in step 308. The peak temperature of the solder reflow profile can be selected to adjust the degree of solder wetting (activity of molten solder with copper) to the bond pad. The soak time between 150 C. and 183 C. in the solder reflow profile can be changed from about 90 seconds (as is typical) to about 30 seconds to adjust the reaction of flux with OSP. The peak temperature can be reduced from about 220–235 C. to about 200–210 C. The "Experimental Results" section below discusses particular heat profiles.

Experimental Results

Experiments at LSI Logic Corporation have been performed to determine the effect of process parameter variation on solder reflow. The test method used was a solder spread test. A 40×40 mm OSP coated test coupon was used. OSP test coupons were first subjected to the heat excursion that was specified in each experiment. All heat excursion conditions, normal and worst cases were chosen to simulate the conditions that would occur during a typical assembly. A control volume of flux was then deposited onto the coupon. Either 10 mil diameter or 30 mil diameter 63Sn/37Pb solder balls were manually placed and sent to reflow using a conventional reflow furnace. The resulting samples were then measured the reflowed solder diameter using a microscope. The experiment conditions and results are described in the following sections.

Experiment I: Solderability Study on Chip Attach Process

The factors considered are listed in Table 1. All three fluxes used were no-clean flux (NCF). The difference between Profile 1 and 2 was that Profile 2 has a higher peak temperature and longer dwell time above 183 C. A nitrogen reflow atmosphere was used.

TABLE 1

Factors Considered in Experiment I

| Thermal Excursion | 2 hrs @ 150° C. | 6 hrs @ 150° C. | 2 hrs @ 125° C. | 4 hrs @ 125° C. | 6 hrs @ 125° C. | 8 hrs @ 125° C. |
|---|---|---|---|---|---|---|
| Flux | NCF 1 | NCF 2 | NCF3 | | | |
| Reflow Profile | Profile 1 | Profile 2 | | | | |

To the extent the results of this experiment were not optimal, some possible reasons are as follows:

First, heat excursion degraded the solderability regardless the temperature and time applied.

Second, heat excursion temperature is more critical than time to the solderability. No significant difference was observed on samples subjected to 2, 4, 6 and 8 hours at 125 C. while there was a significant degradation on samples subjected to 2 hours at 150 C.

Third, the results also indicated that Profile 2 with higher peak temperature and/or longer dwell time above 183 C. showed better solder control.

Fourth, NCF 1 showed the best solder control. This flux was evaluated with LSI's primary underfill and eventually used as the primary flux.

A follow-up experiment was pursued to further explore the impact of reflow parameters to the solderability. The factors considered are listed in Table 2. Two new no clean fluxes (NCFs 4 and 5) were evaluated along with the NCFs 1 and 2 using various reflow parameters. Test coupon was subjected to 2 hours at 125 C.

TABLE 2

Factors Considered in Chip Attach Process Follow-Up Experiment

| Flux | NCF 1 | NCF 2 | NCF 4 | NCF 5 |
|---|---|---|---|---|
| Soak Time between 150° C. and 183° C. | Normal | Long | | |
| Flux Activation Temperature | Normal | High | | |
| Reflow Peak Temperature | Normal | High | | |
| Dwell Time Above 183° C. | Normal | Long | | |

The results obtained from this experiment are shown in Table 3. There is no significant difference between various reflow profile parameters. A possible interpretation of these results is that reflow profile can improve the solderability, but only to a certain extent and that flux has the dominant impact on the solderability.

TABLE 3

Results from Chip Attach Process Follow-Up Experiment

| Flux | Soak Time (sec) | Soak Temp. (° C.) | Peak Temp. (° C.) | Dwell Time (sec) | Avg. Solder Dia. (mil) |
|---|---|---|---|---|---|
| NCF 1 | Normal | Normal | Normal | Normal | 32.70 |
| NCF 1 | Long | High | High | Long | 32.94 |
| NCF 2 | Normal | Normal | High | Long | 29.69 |
| NCF 2 | Long | High | Normal | Normal | 25.74 |
| NCF 4 | Normal | High | Normal | Long | 37.80 |
| NCF 4 | Long | Normal | High | Normal | 38.03 |

TABLE 3-continued

Results from Chip Attach Process Follow-Up Experiment

| Flux | Soak Time (sec) | Soak Temp. (° C.) | Peak Temp. (° C.) | Dwell Time (sec) | Avg. Solder Dia. (mil) |
|---|---|---|---|---|---|
| NCF 5 | Normal | High | High | Normal | 28.35 |
| NCF 5 | Long | Normal | Normal | Long | 30.46 |

Experiment II: Solderability Study on Ball Attach Process

The factors considered are listed in Table 4. The purpose of this experiment was to assess the solderability that would be experienced during ball attach process. The flux used was water soluble flux (WSF). Profile 1 has a higher peak temperature/longest dwell time above 183 C., Profile 2 has a moderate highest peak temperature/moderate dwell time, and Profile 3 has a lower peak temperature/lower dwell time. The range of peak temperature was from 205 C. to 240 C. and the range of dwell time was from 50 seconds to 90 seconds.

TABLE 4

Factors Considered in Experiment II

| | 8 hrs @ 150° C. + 1 reflow pass | 12 hrs @ 150° C. + 1 reflow pass | 16 hrs @ 125° C. + 1 reflow pass |
|---|---|---|---|
| Thermal Excursion | | | |
| Reflow Profile | Profile 1 | Profile 2 | Profile 3 |
| Plasma Etching | Yes | No | |
| Post-Chip Attach Cleaning | Yes | No | |
| Flux | Water Soluble Type | | |

The results obtained are shown in Table 5. One possible interpretation of these results is as follows.

First, there is no significant difference between thermal excursion, plasma etching, and post-chip attach cleaning. The results could be because the flux used was active enough to compensate any OSP solderability degradation or OSP material and coating thickness are reliable enough to withstand each process step described above.

Second, both Profile 1 and Profile 2 showed the same solderability while Profile 3 resulted in poor solderability. It was further found that Profile 3 has a much shorter soak time between 150 C and 183 compared to Profile 1 and Profile 2. One possible interpretation of these results is that soak time between 150 C. and 183 C. is another important parameter to be monitored along with the requirement of peak temperature and dwell time above 183 C. In general, the soak time enables the flux to be activated, penetrate the OSP, and clean the Cu surface.

TABLE 5

Results from Experiment II

| | Thermal Excusion | Reflow Profile | Plasma | Post Chip Attach Cleaning | Avg. Solder Dia. (mil) |
|---|---|---|---|---|---|
| 1 | 6 hrs @ 150° C. + 1 Reflow Pass | Profile 1 | Yes | No | 31.28 |
| 2 | 10 hrs @ 150° C. + 1 Reflow Pass | Profile 1 | Yes | No | 31.25 |
| 3 | 12 hrs @ 125° C. + 1 Reflow Pass | Profile 1 | Yes | No | 30.96 |

TABLE 5-continued

Results from Experiment II

| | Thermal Excusion | Reflow Profile | Plasma | Post Chip Attach Cleaning | Avg. Solder Dia. (mil) |
|---|---|---|---|---|---|
| 4 | 6 hrs @ 150° C. + 1 Reflow Pass | Profile 1 | No | No | 30.04 |
| 5 | 6 hrs @ 150° C. + 1 Reflow Pass | Profile 1 | Yes | Yes | 29.53 |
| 6 | 6 hrs @ 150° C. + 1 Reflow Pass | Profile 2 | Yes | No | 33.32 |
| 7 | 10 hrs @ 150° C. + 1 Reflow Pass | Profile 2 | Yes | No | 31.77 |
| 8 | 12 hrs @ 125° C. + 1 Reflow Pass | Profile 2 | Yes | No | 30.91 |
| 9 | 6 hrs @ 150° C. + 1 Reflow Pass | Profile 3 | Yes | No | 12.03 |

Based on the results derived from Experiment II, an additional experiment was pursued to study the non-wet and partial wet solder ball using actual package. The factors considered are listed in Table 6.

TABLE 6

Factors Considered in Partial Wet Solder Ball Study

| | | 1 Reflow Pass + 2 hrs @ 125° C. + |
|---|---|---|
| Thermal Excursion | 1 Reflow Pass | 8 hrs @ 150° C. |
| Ball Attach Flux Deposition | Normal | Offset 20% from center |
| Reflow Profile | Low Peak Temperature | High Peak Temperature |

The results obtained are shown in Table 7. One possible interpretation of these results is as follows.

Partial wet/non-wet solder ball mainly is a result of fluxing process and reflow profile. Heat excursion only has little impact as observed in Experiment II.

In general, higher peak temperature and/or longer dwell time above 183 C. would give better results. These conditions give molten solder has better chance to react with OSP and pushed OSP away to compensate the flux offset. This interpretation is consistent with the results obtained from Experiment II.

Increasing flux amount and/or flux coverage to 100% of pad area should further enhance the yield.

Experiment III: Effect of OSP Thickness

This experiment was conducted to determine the effect of OSP coating thickness on solderability using the solder spread test. The factors to be considered are listed in Table 8. Thermal excursion 2 hours and 6 hours at 125 C. were used along with NCF1 to represent chip attach process liked condition while other two thermal excursions were used along with WSF to represent ball attach liked condition.

TABLE 8

Factors Considered in Experiment III

| OSP Thickness | 0.2 um | 0.35 um | 0.5 um | 0.6 um | 0.7 um |
|---|---|---|---|---|---|
| Thermal Excursion | 2 hrs @ 125° C. | 6 hrs @ 125° C. | 2 hrs @ 125° C. + 1 reflow pass + 8 hrs @ 150° C. | 6 hrs @ 125° C. + 1 reflow pass + 12 hrs @ 150° C. | |

There was no significant trend and/or difference observed with respect to various OSP thickness and heat excursion conditions. These results are somehow opposed to the results concluded by other research (S. Adams, E. Chang, B. Fruhberger, L. Link, K. Wengenroth, and J. Fudala, *Atmosphere and Flux Effects on an OSP Coating*, NEPCON West, 1997). On the other hand, the results indicated that there is a robust and reliable OSP material and process and/or fluxes that would compensate any degradation that occurred.

In addition to this evaluation, a task was pursued simultaneously to measure the OSP thickness after thermal excursion. Table 9 lists the conditions and results.

TABLE 9

OSP Thickness Measurement with Various Thermal Excursions

| | 0.25 um | | 0.35 um | | 0.7 um | |
|---|---|---|---|---|---|---|
| | OSP Measurement after heat excursion | | | | | |
| OSP Target Thickness | Thickness (um) | % Reduction | Thickness (um) | % Reduction | Thickness (um) | % Reduction |
| 0 h | 0.23 | | 0.35 | | 0.63 | |
| 2 h @ 125° C. | 0.19 | 17% | 0.27 | 23% | 0.58 | 8% |
| 2 h @ 125° C. + 1 reflow pass | 0.18 | 22% | 0.28 | 20% | 0.58 | 8% |

TABLE 7

Results from Partial Wet Solder Ball Study

| | | Reflow | 1.1. # Partial/Non-Wet Solder Ball | | | | |
|---|---|---|---|---|---|---|---|
| Thermal Excursion | B/A Fluxing | Profile | Sample 1 | Sample 2 | Sample 3 | Sample 4 | Sample 5 |
| 1 reflow pass only | Normal | Low Peak | 2 | 2 | 0 | 0 | 0 |
| 1 reflow pass only | Offset-20% | High Peak | 0 | 0 | 0 | 0 | 0 |
| 2 hrs @ 125 C. + 1 reflow pass + 8 hrs @ 150 C. | Normal | High Peak | 1 | 1 | 0 | 0 | 0 |
| 2 hrs @ 125 C. + 1 reflow pass + 8 hrs @ 150 C. | Offset-20% | Low Peak | 10 | 28 | 48 | 14 | 0 |
| 2 hrs @ 125 C. + 1 reflow pass + 8 hrs @ 150 C. | Normal | Low Peak | 0 | 0 | 0 | 0 | 0 |
| 2 hrs @ 125 C. + 1 reflow pass + 8 hrs @ 150 C. | Offset-20% | High Peak | 0 | 0 | 0 | 0 | 0 |

TABLE 9-continued

<table>
<tr><th rowspan="3">OSP Target Thickness</th><th colspan="6">OSP Thickness Measurement with Various Thermal Excursions</th></tr>
<tr><th colspan="2">0.25 um</th><th colspan="2">0.35 um</th><th colspan="2">0.7 um</th></tr>
<tr><th colspan="6">OSP Measurement after heat excursion</th></tr>
<tr><th></th><th>Thickness (um)</th><th>% Reduction</th><th>Thickness (um)</th><th>% Reduction</th><th>Thickness (um)</th><th>% Reduction</th></tr>
<tr><td>8 h @ 125° C. + 1 reflow pass + 4 h @ 150° C.</td><td>0.17</td><td>26%</td><td>0.23</td><td>34%</td><td>0.41</td><td>35%</td></tr>
</table>

After thermal exposure, the OSP coating does not completely volatilize under typical assembly conditions. The Applicants have been informed that that thermal exposure causes the OSP thickness to decrease slightly and taper off at the thickness of the mono-molecular layer of OSP at the Cu surface (~0.15 um). A change in the color of the OSP coupons with thermal exposure was also observed. This was attributed to the porosity induced in the OSP coating at high temperatures that could expose the underlying Cu to some oxidation and lead to color change. These pores close upon cooling down to lower temperatures preventing any further exposure of the Cu. However, as demonstrated in the solderability experiments, the color change did not have any effect on the solderability of the parts.

Selective Oxidation

FIG. 4 is a flow chart that shows a method of attaching solder balls to a bond substrate according to one aspect of the present invention. In step 400, an OSP is applied to bond pads on the substrate. In the method shown in FIG. 4, it is important that the OSP not be applied to the traces on the substrate (as opposed to the bond pads connected to the traces). This may be achieved by applying the OSP only to the bond pads or by applying the OSP to the entire substrate and etching away the OSP in all areas other than the bond pads. In step 402, the traces on the substrate are oxidized (the OSP on the bond pads prevents them from becoming oxidized). In step 404, a solder mask such as the solder mask shown in FIG. 2 is applied to the substrate.

The solder balls are then disposed on the bond pads as shown in step 406 and then reflowed as shown in step 408. The oxidation layer on the traces prevents solder from spreading onto the traces.

Conclusion

Numerous variations and modifications will become apparent to those skilled in the art once the above disclosure is fully appreciated. It is intended that the following claims be interpreted to embrace all such variations and modifications.

What is claimed is:

1. A method for attaching a plurality of solder balls to a substrate, the substrate comprising a plurality of bond pads and respective traces connected to the bond pads, the method comprising the steps of:

applying an organic solderability preserve to the substrate to cover the bond pads, wherein at least portions of the traces that are proximate to the bond pads remain uncovered by the organic solderability preserve;

oxidizing the uncovered portions of the traces to form an oxidation layer on the portions of the traces, wherein the organic solderability preserve on the bond pads prevents substantial oxidation of the bond pads during the step of oxidizing;

placing a solder mask on the substrate, the solder mask having an opening that exposes both the plurality of bond pads and the portions of the traces that are proximate to the bond pads;

after the step of oxidizing, disposing each of the plurality of solder balls on a corresponding one of the plurality of bond pads; and reflowing the solder balls, wherein the oxidation layer inhibits the solder from flowing onto the uncovered portions of the traces such that substantially none of the solder is brought into contact with the traces.

2. The method of claim 1 wherein the step of applying the organic solderability preserve comprises the steps of applying the organic solderability preserve to the substrate and etching away the organic solderability preserve in all areas other than the bond pads.

3. The method of claim 1 wherein the traces comprise copper.

* * * * *